(12) United States Patent
Sakamoto

(10) Patent No.: US 6,399,877 B1
(45) Date of Patent: Jun. 4, 2002

(54) HEAT SINK

(76) Inventor: Takahiro Sakamoto, c/o NEC Yonezawa, Ltd. 6-80, Shimohanazawa 2-chome, Yonezawa-shi Yamagata (JP)

(*) Notice: Subject to any disclaimer, the term of this patent is extended or adjusted under 35 U.S.C. 154(b) by 0 days.

(21) Appl. No.: 09/576,306

(22) Filed: May 23, 2000

(30) Foreign Application Priority Data

May 24, 1999 (JP) .......................................... 11-144085

(51) Int. Cl.⁷ ................................................ H05K 7/20
(52) U.S. Cl. ............................... 174/16.3; 165/104.33; 361/695; 361/700
(58) Field of Search .............................. 174/15.2, 16.3; 165/104.22, 104.33, 122; 361/695, 719, 687, 700, 696, 697, 702, 703

(56) References Cited

U.S. PATENT DOCUMENTS

| | | | |
|---|---|---|---|
| 5,339,214 A | * 8/1994 | Nelson | .................. 174/15.2 X |
| 5,871,396 A | * 2/1999 | Shen | ....................... 361/695 X |
| 5,946,190 A | * 8/1999 | Patel et al. | ............. 174/15.2 X |
| 6,105,662 A | * 8/2000 | Suzuki | .................... 174/15.2 X |
| 6,160,223 A | * 12/2000 | Gates | ....................... 361/719 X |

* cited by examiner

*Primary Examiner*—Chau N. Nguyen
(74) *Attorney, Agent, or Firm*—Dickstein Shapiro Morin & Oshinsky LLP

(57) ABSTRACT

A heat sink is provided that can efficiently dissipate heat-producing components, e.g. semiconductor devices, thus realizing small, slim, high-performance electronic equipment. The heat sink includes a plate section, a heat dissipation fin section, and a heat pipe. The plate section has an elevated section on which heat-producing components, or semiconductor devices, are mounted. The heat dissipation fin section includes a plurality of fins formed on one side of the plate section. The heat pipe is arranged over the heat-producing component mounting area and the heat dissipation fin section. The front area of the plate section is larger than that of the heat dissipation fin section.

26 Claims, 5 Drawing Sheets

HEAT SINK

BACKGROUND OF THE INVENTION

The present invention relates to a heat sink that cools heat-producing components, e.g. semiconductor devices, incorporated in electronic equipment.

Conventionally, semiconductor devices such as ICs and LSIs incorporated within electronic equipment such as notebook-size computers or portable communications equipment are mounted on a heat sink to cool them and to derive their full performances therefrom.

Some heat sinks have a heat dissipation fin section that radiates the heat generated within heat-producing components, e.g. semiconductor elements. Moreover, heat sinks carrying a heat pipe that transfers the heat toward heat fins are well known.

Recent trends in high-performance and downsizing of electronic equipment have boost the power consumption of semiconductor devices. The high packaging density causes a large amount of heat dissipation per area.

One approach to overcome the increased heat dissipation may be to use large heat dissipation fin sections for a heat sink but leads to a large-sized heat sink. However, there is the problem in that such a large heat sink cannot be adapted to slimmed electronic equipment such as notebook-size computers.

For that reason, it has been difficult to provide a heat sink that efficiently radiates the heat generated within a heat-producing component in downsized, thinned electronic equipment.

SUMMARY OF THE INVENTION

The present invention is made to solve the above-mentioned problems.

Moreover, the objective of the invention is to provide a heat sink that can efficiently dissipate the heat generated within heat-producing components such as semiconductor devices, thus miniaturizing and thinning electronic equipment and realizing high-performance electronic equipment.

The objective of the present invention is achieved by a heat sink, on which heat-producing components such as semiconductor devices are mounted, to cool the heat-producing components, comprising a plate section on which the heat-producing components are mounted; a heat dissipation fin section attached on the plate section; and a heat pipe arranged from an area of the plate section, on which the heat-producing components are mounted, to the heat dissipation fin section; the plate section having a front area larger than that of the heat dissipation fin section.

As described above, the plate section, on which heat-producing components such as semiconductor devices are mounted, has a larger front area than the heat dissipation fin section. Hence, the heat pipe can conduct the heat generated within heat-producing components toward not only the heat dissipation fin sections but also the whole of the plate section. This feature can easily deal with heat-producing components of which the heat dissipation is increased with the increased high performance of electronic equipment.

The enlarged plate section can aim at miniaturizing and thinning the heat dissipation fin section. Thus, it can be dealt with small-sized, particularly, thinned, high-performance electronic equipment.

According to the present invention, the heat sink further comprises an elevated section on which the heat-producing components are mountable, the elevated section being formed on the heat-producing component mounting area of a surface of the plate section.

Since the elevated section is formed on the area (or at the position) where heating elements are mounted, the heat-producing component mounting area is protruded from the surface of the plate section. This feature can eliminate the interference between the plate section and other components assembled on a heat-producing component mounted printed board.

According to the present invention, the heat sink further comprises a plurality of heat pipes that run over the heat-producing component mounting area of the plate section.

In the above structure, a plurality of heat pipes can very quickly conduct the heat generated from heat-producing components to the heat dissipation fin section and to the entire plate section.

Moreover, in the heat sink according to the present invention, the heat dissipation fin section comprises a plurality of fins formed on the front surface or the back surface of the plate section.

That is, the heat dissipation fin section, which is formed of plural fins formed on the front and back surfaces of the plate section, can improve its heat dissipation efficiency.

Furthermore, according to the present invention, the heat sink further comprises a cooling fan coupled to the heat dissipation fin section by means of a duct.

As described above, the cooling fan is coupled to the heat dissipation fin section by means of a duct. When the cooling fan is operated, the duct can efficiently introduce the air into the fins forming the heat dissipation fin section. Thus, this structure largely can increase the heat dissipation efficiency of the heat dissipation fin section, thus more efficiently cooling the heat-producing components.

BRIEF DESCRIPTION OF THE INVENTION

This and other objects, features, and advantages of the present invention will become more apparent upon a reading of the following detailed description and drawings, in which.

DESCRIPTION OF THE EMBODIMENTS

Heat sinks according to embodiments of the present invention will be described below in detail with reference to the attached drawings.

Figure 1:
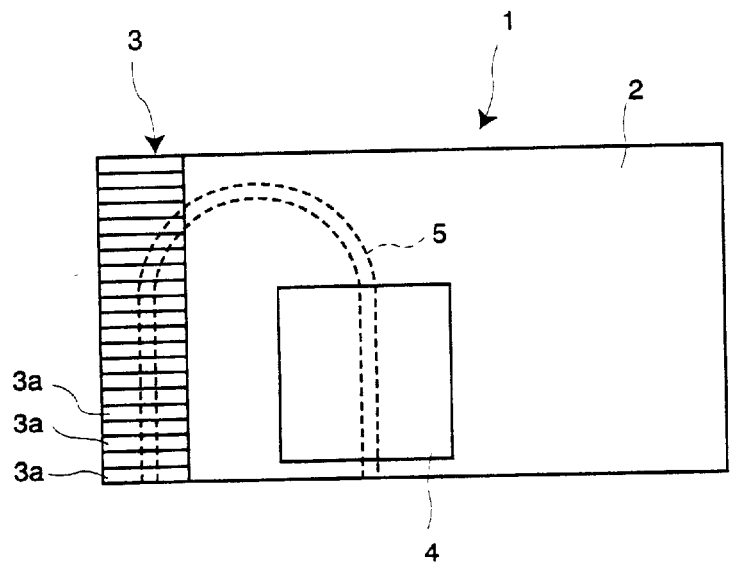
FIG. 1 is a plan view illustrating a heat sink according to a first embodiment of the present invention.
Figure 2:
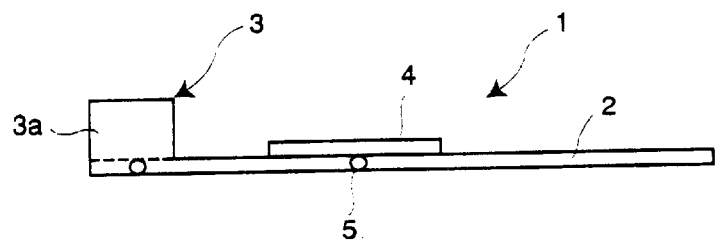
FIG. 2 is a cross sectional view illustrating a heat sink according to the first embodiment of the present invention.
Figure 3:
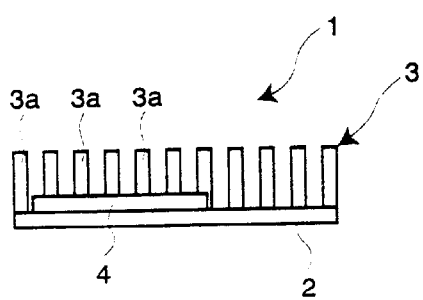
FIG. 3 is a front view illustrating a heat sink according to the first embodiment of the present invention.

Referring to FIG. 1, a heat sink 1 has a flat plate section 2 and a heat dissipation fin section fin 3 formed of a plurality of fins 3a. The heat dissipation fin section 3 is arranged on the surface (i.e., the front surface or back surface) of one side of the plate section 2. The heat dissipation fin section 3 is formed of a metal material, e.g. aluminum, with good thermal conductivity.

In order to increase the thermal capacity and heat dissipation of the heat sink 1, the plate section 2 has a larger front area than the heat dissipation fin section 3 and has a sufficient thickness. An elevated section 4, on which heat-producing components such as semiconductor devices e.g. ICs or LSIs are adhesively mounted via silicone grease, is formed on a front surface of the plate section 2.

An U-shaped heat pipe 5, running from the elevated section 4 or the heat-producing component mounting section to the heat dissipation fin section 3, is embedded in the plate section 2 of the heat sink 1. The heat pipe 5 is filled with an operating fluid.

The heat sink 1 transfers the heat generated from heat-producing components attached on the elevated section through the whole surface of the plate section 2, thus dissipating it from the outer surfaces thereof.

The heat conducted to the plate section 2 is directly transferred to the heat dissipation fin section 3 to be dissipated by the fins 3a. The heat pipe 5 quickly conducts the heat generated by heat-producing components toward heat dissipation fin section 3 to dissipate it from the fins 3a to the air.

In the heat sink 1, the front area of the plate section 2 on which heat-producing components, e.g. semiconductor devices, are mounted is larger than that of the heat dissipation fin section 3. Hence, the heat generated within the heat-producing components is both conducted to and dissipated by the heat dissipation fin section 3 through the heat pipe 5 and is also dispersed and dissipated through the whole surface of the plate section 2. As a result, this structure can easily deal with heat-producing components with a heat value increased with the trend in high performance of electronic equipment.

Widening the plate section 2 allows the heat dissipation fin section 3 to be miniaturized and slimmed. This heat sink can be easily adapted to small, slim electronic equipment.

The elevated section 4 is formed on the heat-producing component mounting area so as to protrude from the surface of the plate section 2 so that interference between the plate section 2 and other parts assembled on the printed board can be eliminated.

Figure 4:
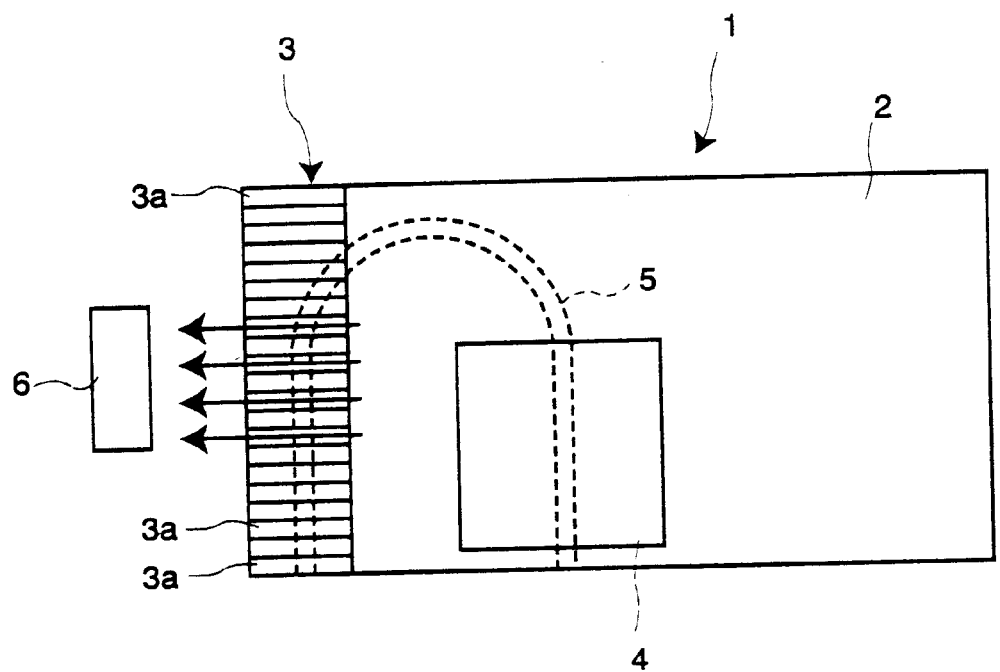
FIG. 4 is a plan view illustrating a heat sink according to the first embodiment of the present invention.
Figure 5:
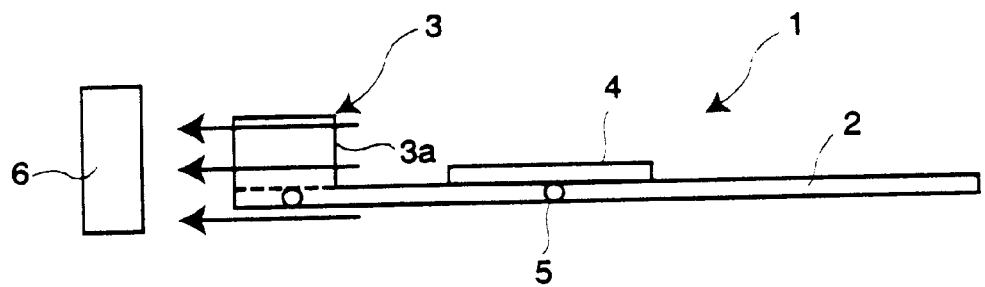
FIG. 5 is a cross sectional view illustrating a heat sink according to the first embodiment of the present invention.

A cooling fan 6 is provided near the heat dissipation fin section 3, as shown in FIGS. 4 and 5, to effectively cool heat-producing components by means of the heat sink 1. The cooling fan 6 draws in the air to provide a current of air through the fins 3a of the heat dissipation fin section 3.

Thus, the current of air can cool the respective fins 3a of the heat dissipation fin section 3 so that the heat-producing component cooling efficiency of the heat sink 1 is further improved.

Second Embodiment

Figure 6:
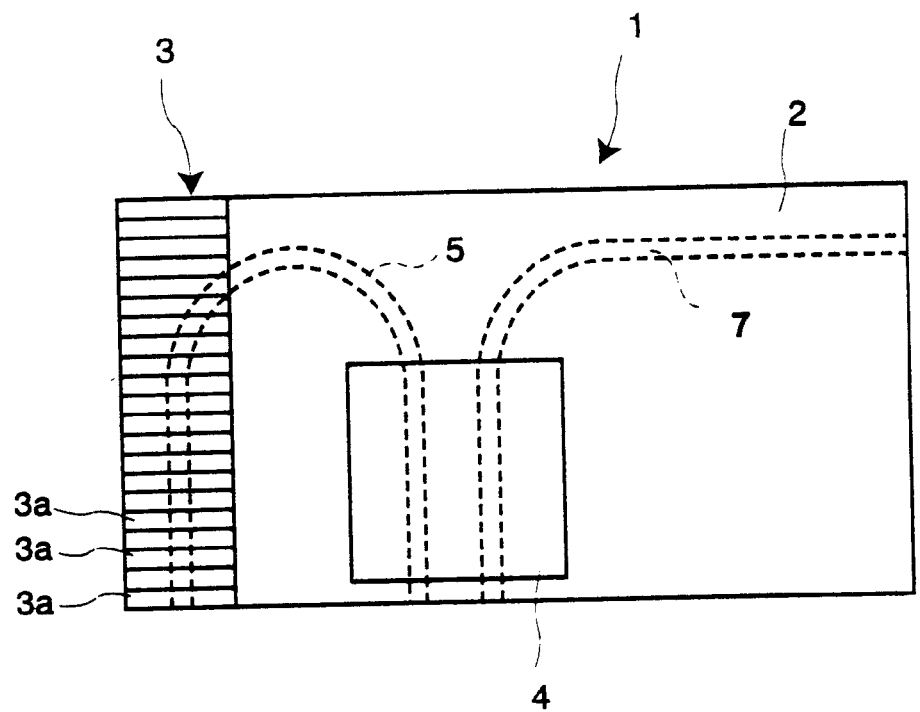
FIG. 6 is a plan view illustrating a heat sink according to a second embodiment of the present invention.

In the heat sink 1, shown in FIG. 6, a heat pipe 5 is arranged to extend from the elevated section 4, or the area on which heat-producing components are mounted, to the heat dissipation fin section 3. Meanwhile, a pipe 7 is arranged to extend from the elevated section 4 in the opposite direction to the heat dissipation fin section 3. According to the heat sink 1, plural heat pipes may be used to more efficiently and quickly convey the heat produced within heat-producing components through the whole surface of the plate section 2.

Third Embodiment

Figure 7:
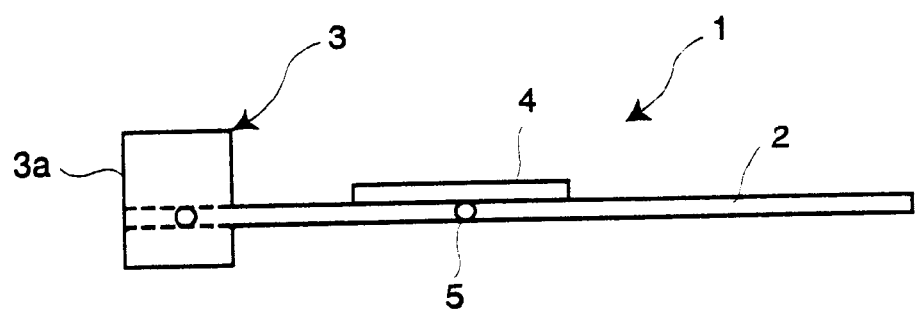
FIG. 7 is a cross sectional view illustrating a heat sink according to a third embodiment of the present invention.
Figure 8:
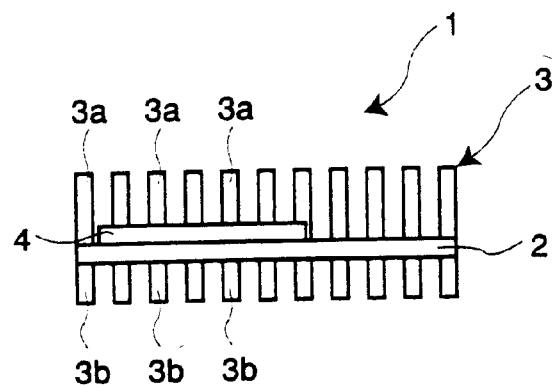
FIG. 8 is a front view illustrating a heat sink according to the third embodiment of the present invention.

In the heat sink 1 shown in FIGS. 7 and 8, the heat dissipation fin section 3 consists of a fin 3a formed on a front surface of the plate section 2 and a fin 3b formed on a back surface of the plate section 2.

In other words, this heat sink 1 has a heat dissipation fin section 3 with a surface area increased by the surface area of the fin 3b, thus largely increasing the heat dissipation efficiency.

Fourth Embodiment

Figure 9:
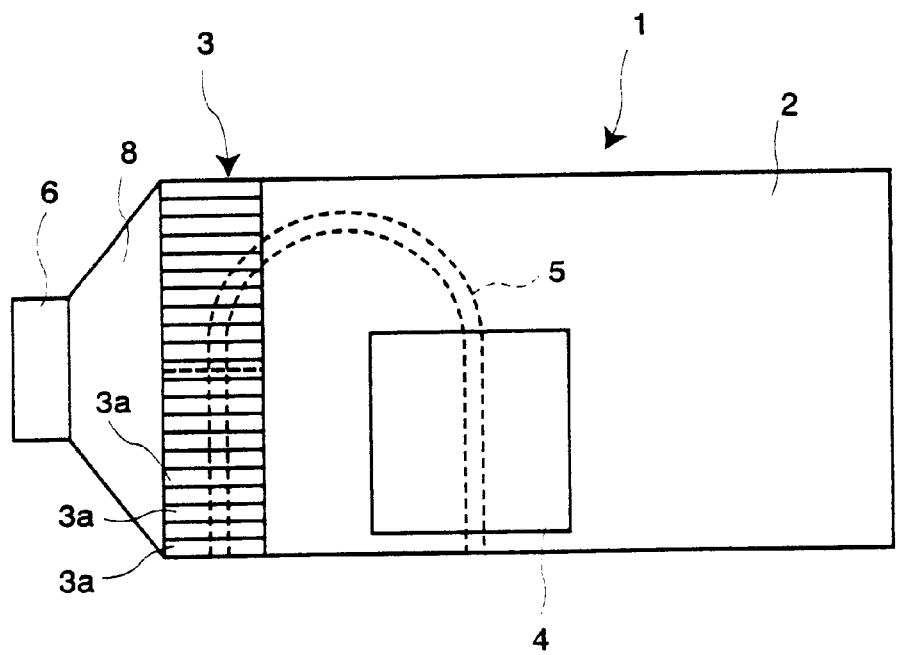
FIG. 9 is a plan view illustrating a heat sink according to a fourth embodiment of the present invention.
Figure 10:
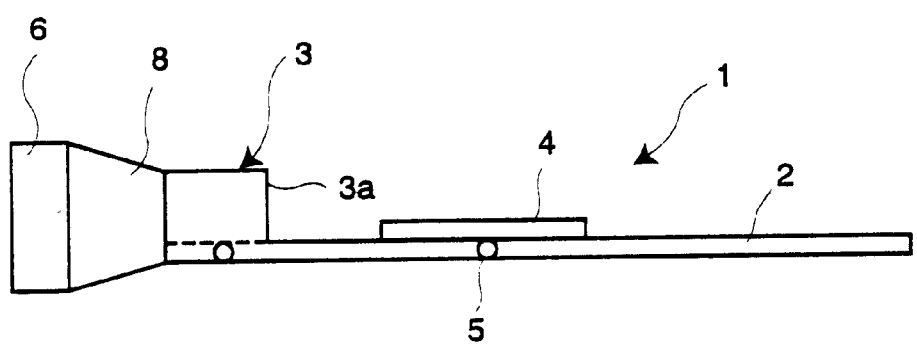
FIG. 10 is a cross sectional view illustrating a heat sink according to the fourth embodiment of the present invention.

The heat sink 1, shown in FIGS. 9 and 10, has a duct 8 that is connected between the heat dissipation fin section 3 and a cooling fan 6.

In the heat sink 1, the duct 8 can equally convey the wind to the respective fins 3a of the heat dissipation fin section 3 when the cooling fan 6 is being operated. Thus, this structure can largely increase the heat dissipation efficiency of the heat dissipation fin section 3, thus improving the cooling efficiency of the heat-producing component.

As described above, the heat sinks according to the present invention can provide the following advantages.

In the heat sink according to one aspect of the present invention, the front area of the plate section, which mounts heat-producing components, such as semiconductor elements, is larger than that of the heat dissipation fin section. Hence, the heat pipe can not only convey and dissipate the heat generated within heat-producing components to the heat dissipation fin section and but also distributively dissipate it to the whole plate section. This heat sink can be easily adapted to heat-producing components with a large heat value increased with the enhanced performance of electronic equipment.

Widening the plate section allows small, slim, heat dissipation fin sections. Hence, the heat sink can easily deal with high performance electronic equipment small-sized, particularly slimmmed.

The heat sink, according to another aspect of the invention, has an elevated section on which heat-producing components are mounted. Hence, the heat-producing component mounting area is lifted from the surface of the plate section. This feature can eliminate interference between other parts assembled on the printed board and the plate section.

In the heat sink according to further another aspect of the invention, plural heat pipes can quickly convey the heat produced within heat-producing components to the heat dissipation fin section and to the whole plate section.

In the heat sink according to still another aspect of the invention, the dissipation fin is formed of plural heat dissipation fin sections formed on the front and back surfaces of the plate section. Thus, the heat dissipation fin section can provide improved heat dissipation efficiency.

In the heat sink according to further another aspect of the invention, a duct couples the cooling fan to the heat dissipation fin section. Hence, when the cooling fan is operated, the duct can effectively guide the air to respective fins forming the heat dissipation fin section. This feature allows the heat dissipation efficiency of the heat dissipation fin section to be highly and the cooling efficiency of the heat-producing components to be improved.

The entire disclosure of Japanese Application No. 11-144085 filed May 24, 1999 including specification, claims, drawing and summary are incorporated herein by reference in its entirely.

What is claimed is:

1. A heat sink, on which heat-producing components are mounted to cool said heat-producing components, said heat sink comprising:
   a plate section having a heat-producing component mounting area;
   an elevated section on which said heat-producing components are mountable, said elevated section being formed on said heat-producing component mounting area of said plate section;
   a heat dissipation fin section attached on said plate section; and
   a heat pipe arranged from said area of said plate section on which said heat-producing components are mounted to said heat dissipation fin section, said heat pipe contacting said plate section along the heat pipe's entire length between said area on which said heat-producing components are mounted and said heat dissipation fin section;
   said plate section having a front area larger than that of said heat dissipation fin section.

2. The heat sink defined in claim 1, further comprising at least one additional heat pipe that runs over said heat-producing component mounting area of said plate section.

3. The heat sink defined in claim 1, where said heat dissipation fin section comprises a plurality of fins formed on a front surface or a back surface of said plate section.

4. The heat sink defined in claim 1, further comprising a cooling fan coupled to said heat dissipation fin section by means of a duct.

5. A heat sink, on which heat-producing components are mounted to cool said heat-producing components, said heat sink comprising:
   a plate section;
   an elevated section on a surface of said plate section, said elevated section having said heat-producing components mounted thereon;
   a heat dissipation fin section attached on said plate section;
   a heat pipe arranged from said elevated section to said heat dissipation fin section, said heat pipe contacting said plate section along the heat pipe's entire length between said elevated section and said heat dissipation fin section;
   a cooling fan mounted near said heat dissipation fin section;
   said plate section having a front area larger than that of said heat dissipation fin section; and
   whereby said cooling fan takes in the air to flow it through said heat dissipation fin section.

6. The heat sink defined in claim 5, wherein said heat pipe is embedded within said plate section.

7. A heat sink, comprising:
   a heat conductive plate including a mounting section having an electronic component mounting area which is adapted to receive one or more heat generating electrical components;
   a heat fin section extending from said plate; and
   a heat pipe located within said heat conductive plate and extending from said electronic component mounting area to an area of said heat conductive plate from which said heat fin section extends,
   wherein said heat pipe is U-shaped as viewed along a major surface of said plate.

8. The heat sink of claim 7, wherein said heat fin section extends perpendicular to a major plane of said conductive plate.

9. The heat sink of claim 7, wherein said plate has an upper surface and said heat fin section extends from said upper surface.

10. The heat sink of claim 7, wherein said plate has an upper and a lower surface and wherein said heat fin section extends from both said upper and said lower surfaces.

11. The heat sink of claim 7, wherein said heat pipe is embedded within said plate.

12. The heat sink of claim 7, wherein said heat pipe contacts said heat conductive plate along said heat pipe's entire length between said mounting section and said heat dissipation fin section.

13. A heat sink, comprising:
   a heat conductive plate including a mounting section having an electronic component mounting area which is adapted to receive one or more heat generating electrical components;
   a heat fin section extending from said plate; and
   a plurality of heat pipes located within said heat conductive plate, each of said plurality of heat pipes extending from said electronic component mounting area, at least one of said plurality of heat pipes extending to an area of said plate from which said heat fin section extends, and at least two of said plurality of heat pipes extending in different directions.

14. A heat sink, comprising:
   a heat conductive plate including a mounting section having an electronic component mounting area which is adapted to receive one or more heat generating electrical components;
   a heat fin section extending from said plate; and
   a plurality of heat pipes located within said heat conductive plate, each of said plurality of heat pipes extending from said electronic component mounting area, at least one of said plurality of heat pipes extending to an area of said heat conductive plate from which said heat fin section extends, and at least two of said plurality of heat pipes extending in opposite directions.

15. The combination, comprising:
   (A) a heat generating electronic component; and
   (B) a heat sink, including:
      (1) a heat conductive plate including a mounting section;
      (2) a raised portion located on said mounting section, said raised portion having an electronic component mounting area on which said heat generating electronic component is mounted;
      (3) a heat fin section extending from said plate; and
      (4) a heat pipe located within said heat conductive plate and extending from said mounting section to an area of said plate from which said heat fin section extends.

16. The combination, comprising:
   (A) a heat generating electronic component; and
   (B) a heat sink, including:
      (1) a heat conductive plate including a mounting section having an electronic component mounting area on which said heat generating electronic component is mounted;
      (2) a heat fin section extending from said plate; and (3) a heat pipe located within said heat conductive plate and extending from said electronic component mounting area to an area of said heat conductive plate from which said heat fin section extends, wherein said heat pipe is U-shaped as viewed along a major surface of said plate.

17. The combination of claim 16, wherein there are a plurality of heat generating electronic components mounted on said electronic component mounting area.

18. The combination of claim 16, wherein said heat fin section extends perpendicular to a major plane of said conductive plate.

19. The combination of claim 16, wherein said plate has an upper surface and said heat fin section extends from said upper surface.

20. The combination of claim 16, wherein said plate has an upper and a lower surface and wherein said heat fin section extends from both said upper and said lower surfaces.

21. The combination of claim 16, further including a fan for circulating air across said heat fin section.

22. The combination of claim 21, further including a duct coupling said fan to said heat fin section.

23. The combination of claim 16, wherein said heat pipe contacts said heat conductive plate along said heat pipe's entire length between said mounting section and said heat dissipation fin section.

24. The combination of claim 16, wherein said heat pipe is embedded within said plate.

25. The combination, comprising:

(A) a heat generating electronic component; and (B) a heat sink, including:

(1) a heat conductive plate including a mounting section having an electronic component mounting area on which said heat generating electronic component is mounted;

(2) a heat fin section extending from said plate; and (3) a plurality of heat pipes located within said heat conductive plate, each of said plurality of heat pipes extending from said electronic component mounting area, at least one of said plurality of heat pipes extending to an area of said heat conductive plate from which said heat fin section extends, and at least two of said plurality of heat pipes extending in different directions.

26. The combination, comprising:

(A) a heat generating electronic component; and (B) a heat sink, including:

(1) a heat conductive plate including a mounting section having an electronic component mounting area on which said heat generating electronic component is mounted;

(2) a heat fin section extending from said plate; and (3) a plurality of heat pipes located within said heat conductive plate, each of said plurality of heat pipes extending from said electronic component mounting area, at least one of said plurality of heat pipes extending to an area of said heat conductive plate from which said heat fin section extends, and at least two of said plurality of heat pipes extending in opposite directions.

* * * * *